United States Patent
Cheng et al.

(10) Patent No.: US 8,297,062 B2
(45) Date of Patent: Oct. 30, 2012

(54) HEAT-DISSIPATING DEVICE FOR SUPPLYING COLD AIRFLOW

(75) Inventors: Chih-Hung Cheng, Wugu Township, Taipei County (TW); Ken Hsu, Wugu Township, Taipei County (TW); Chen-Hsiang Lin, Wugu Township, Taipei County (TW); Kuo-Len Lin, Wugu Township, Taipei County (TW)

(73) Assignees: Golden Sun News Techniques Co., Ltd., New Taipei (TW); CPUMate Inc, New Taipei (TW)

( * ) Notice: Subject to any disclaimer, the term of this patent is extended or adjusted under 35 U.S.C. 154(b) by 511 days.

(21) Appl. No.: 12/707,755

(22) Filed: Feb. 18, 2010

(65) Prior Publication Data

US 2011/0197596 A1 Aug. 18, 2011

(51) Int. Cl.
*F25B 21/02* (2006.01)
(52) U.S. Cl. .......................................... 62/3.3
(58) Field of Classification Search ...................... 62/3.2, 62/3.3, 3.6; 165/80, 104.34
See application file for complete search history.

(56) References Cited

U.S. PATENT DOCUMENTS

| | | | |
|---|---|---|---|
| 6,779,595 B1 * | 8/2004 | Chiang | 165/104.33 |
| 7,021,368 B2 * | 4/2006 | Lin et al. | 165/104.33 |
| 2004/0207983 A1 | 10/2004 | Lu et al. | |
| 2005/0073811 A1 * | 4/2005 | Wang et al. | 361/688 |
| 2008/0062694 A1 * | 3/2008 | Lai et al. | 362/294 |
| 2008/0113603 A1 | 5/2008 | Atallah | |
| 2008/0232063 A1 | 9/2008 | Koo | |
| 2009/0310307 A1 * | 12/2009 | Lin et al. | 361/700 |

FOREIGN PATENT DOCUMENTS

| | | |
|---|---|---|
| DE | 2006021829 A1 | 11/2007 |
| EP | 0127711 A1 | 12/1984 |
| WO | 0169694 A1 | 9/2001 |
| WO | 2005031992 A1 | 4/2005 |
| WO | 2009036542 A2 | 3/2009 |

* cited by examiner

*Primary Examiner* — Melvin Jones
(74) *Attorney, Agent, or Firm* — Chun-Ming Shih; HDLS IPR Services

(57) ABSTRACT

A heat-dissipating device (1) including a casing (10), a thermal insulation plate (20), a thermoelectric cooling chip (30), a heat-dissipating body (40), super heat pipes (52), a cooler (53), a first fan (54) and a second fan (60). The thermal insulation plate (20) divides the interior of the casing (10) into a hot air zone (ZH) and a cold air zone (ZC). The thermoelectric cooling chip (30) is disposed on the thermal insulation plate (20) with its hot-end surface (32) facing the hot air zone (ZH). The heat-dissipating body (40) is disposed in the hot air zone (ZH) to contact the hot-end surface (32). The super heat pipes (52) and the cooler (53) thermally contact a cold-end surface (31) of the thermoelectric cooling chip (30). Thus, the cold generated by the cold-end surface (31) can be rapidly and uniformly conducted to other places to form a cold airflow.

15 Claims, 10 Drawing Sheets

HEAT-DISSIPATING DEVICE FOR SUPPLYING COLD AIRFLOW

BACKGROUND OF THE INVENTION

1. Field of the Invention

The present invention relates to a heat-dissipating device, and in particular to a heat-dissipating device for supplying cold airflow.

2. Description of Prior Art

In general, the interior of a computer host is equipped with various electronic elements or devices (such as a central processing unit, a power supply, a hard disk driver or the like) that generate a great amount of heat in operation. Further, a sealed casing is mounted outside the computer host to protect the computer host but unfortunately affect the heat dissipation of the computer host, which causes the accumulation of heat in the computer host together with an elevated temperature. A common solution is to install a heat-dissipating device on the computer host to reduce the inside temperature, thereby protecting the electronic elements and devices in the computer host from suffering damage to affect their normal operation.

A conventional heat-dissipating solution is to install a heat-dissipating fan on a rear surface of the computer host. External air is introduced into the computer host by the heat-dissipating fan to reduce the temperature in the computer host. However, since the weather in Taiwan is warm throughout the year, the temperature of external air is usually in the range of 25 to 35° C. Thus, the above heat-dissipating fan merely blows warm air into the computer host rather than cold air. Therefore, the heat-dissipating effect of the heat-dissipating fan is limited.

With the development of thermoelectric cooling chips, many manufacturers propose a novel heat-dissipating device for the computer host, in which a thermoelectric cooling chip is combined with a fan. After the thermoelectric cooling chip is supplied with electricity, one surface of the thermoelectric cooling chip is heated up and this surface is referred to as a "hot-end surface". The other surface of the thermoelectric cooling chip is cooled down and this surface is referred to as a "cold-end surface". When external air is introduced into the heat-dissipating device by the fan and brought into contact with the cold-end surface, the temperature of the external air will be reduced to form a cold airflow. Then, the cold airflow is introduced into the computer host to lower the temperature of the electronic elements therein.

In practice, after the thermoelectric cooling chip is supplied with electricity, the temperature of the cold-end surface will be lower than 0° C., thereby generating a strong cooling effect. However, if the external air does not exchange heat with the thermoelectric cooling chip to form a cold airflow, frost will be generated on the cold-end surface. As a result, when a user turns off the computer host or de-energizes the thermoelectric cooling chip, the frost on the cold-end surface will be melted to become condensed droplets, which will rust the electronic elements in the computer host and even generate a short circuit.

Further, the conventional heat-dissipating device utilizing the thermoelectric cooling chip still has problems as follows. Some manufacturers utilize a finned cooler to be brought into contact with the cold-end surface, thereby increasing the contact area between the external air and the cold-end surface. However, the actual contact area between the finned cooler and the cold-end surface still remains the area of the cold-end surface. Thus, the cold generated by the cold-end surface cannot be conducted to other places rapidly and uniformly to be heat-exchanged with the external air. Thus, frost will still be generated around the contacting portion between the cold-end surface and the finned cooler. As a result, the frost will be melted to form condensed droplets, and the problems of rust and short circuit still exist.

On the other hand, since the contact area between the fined cooler and the cold-end surface is limited, the heat-exchanging distance between the external air and the finned cooler is also restricted. As a result, the external air cannot be heat-exchanged sufficiently with the cold-end surface, and thus the cold generated by the cold-end surface cannot be distributed uniformly in the external air. In other words, the air close to the cold-end surface is cooler but the air away from the cold-end surface is warmer. Such a temperature gradient becomes larger especially when the travelling distance of the cold airflow is longer in the heat-dissipating device.

In view of the above problems, the present Inventor proposes a novel and reasonable structure based on his expert experience and deliberate researches.

SUMMARY OF THE INVENTION

The present invention is to provide a heat-dissipating device for supplying cold airflow, in which the cold generated by the cold-end surface of the thermoelectric cooling chip can be conducted to other places rapidly and uniformly.

The present invention is to provide a heat-dissipating device for supplying cold airflow, which is capable of generating a cold airflow with a consistent temperature.

The present invention is to provide a heat-dissipating device for supplying cold airflow, which includes a casing provided with a first air inlet, a second air inlet, a cold air outlet, and a hot air outlet in communication with its interior; a thermal insulation plate disposed in the casing for dividing the interior of the casing into a hot air zone and a cold air zone separated completely from the hot air zone, the first air inlet and the cold air outlet being in communication with the cold air zone, the second air inlet and the hot air outlet being in communication with the hot air zone, the thermal insulation plate having a through-hole; a thermoelectric cooling chip having a cold-end surface and a hot-end surface opposite to the cold-end surface, the thermoelectric cooling chip being disposed in the through-hole with the hot-end surface facing the hot air zone; a heat-dissipating body disposed in the hot air zone to abut against the hot-end surface; a cold-airflow supplying module disposed in the cold air zone to abut against the cold-end surface, the cold-airflow supplying module comprising a plurality of super heat pipes, a cooler contacting the super heat pipes and a first fan, the first fan being mounted in the cold air outlet for guiding external air to enter the cold air zone via the first air inlet and be ejected from the cold air outlet; and a second fan mounted in the second air inlet for guiding external air to enter the hot air zone via the second air inlet and be ejected from the hot air outlet.

The present invention is to provide a heat-dissipating device for supplying cold airflow, which includes a casing provided with a first air inlet, a hot air outlet, and a cold air outlet in communication with its interior; a thermal insulation plate disposed in the casing for dividing the interior of the casing into a hot air zone and a cold air zone partially communicated with the hot air zone, the first air inlet and the cold air outlet being in communication with the cold air zone, the hot air outlet being in communication with the hot air zone, the thermal insulation plate having a through-hole; a thermoelectric cooling chip having a cold-end surface and a hot-end surface opposite to the cold-end surface, the thermoelectric cooling chip being disposed in the through-hole with the hot-end surface facing the hot air zone; a heat-dissipating body disposed in the hot air zone to abut against the hot-end surface; a cold-airflow supplying module disposed in the cold air zone to abut against the cold-end surface, the cold-airflow supplying module comprising a plurality of super heat pipes, a cooler contacting the super heat pipes and a first fan, the first fan being mounted in the cold air outlet for guiding external air to enter the cold air zone via the first air inlet and be ejected from the cold air outlet; and a second fan mounted in the hot air zone for guiding a portion of airflow in the cold air zone to enter the hot air zone and be ejected from the hot air outlet.

In comparison with prior art, the present invention has advantageous features as follows.

Since the present invention is provided with a cold-airflow supplying module contacting the cold-end surface of the thermoelectric cooling chip, and the cold-airflow supplying module comprises a plurality of super heat pipes, a cooler contacting the super heat pipes, and a first fan, the cold generated by the cold-end surface can be rapidly and uniformly conducted to the cooler by means of the super heat pipes. In other words, the combination of the super heat pipes and the cooler significantly increases the contact area and heat-exchanging distance with the cold-end surface. Thus, the external air introduced in the heat-dissipating device from the first air inlet can be heat-exchanged with the cooler in the cold air zone sufficiently and uniformly. Thus, frost and condensed droplets will not be generated on the cold-end surface.

According to the above, since the external air introduced in the heat-dissipating device from the first air inlet can be heat-exchanged with the cooler in the cold air zone sufficiently and uniformly, the temperature of the cold air in the cold air zone is so consistent that the airflow finally flowing into a computer host is cold enough.

DETAILED DESCRIPTION OF THE INVENTION

The characteristics and technical contents of the present invention will be described with reference to the accompanying drawings. However, the drawings are illustrative only, but not used to limit the present invention.

Figure 1:
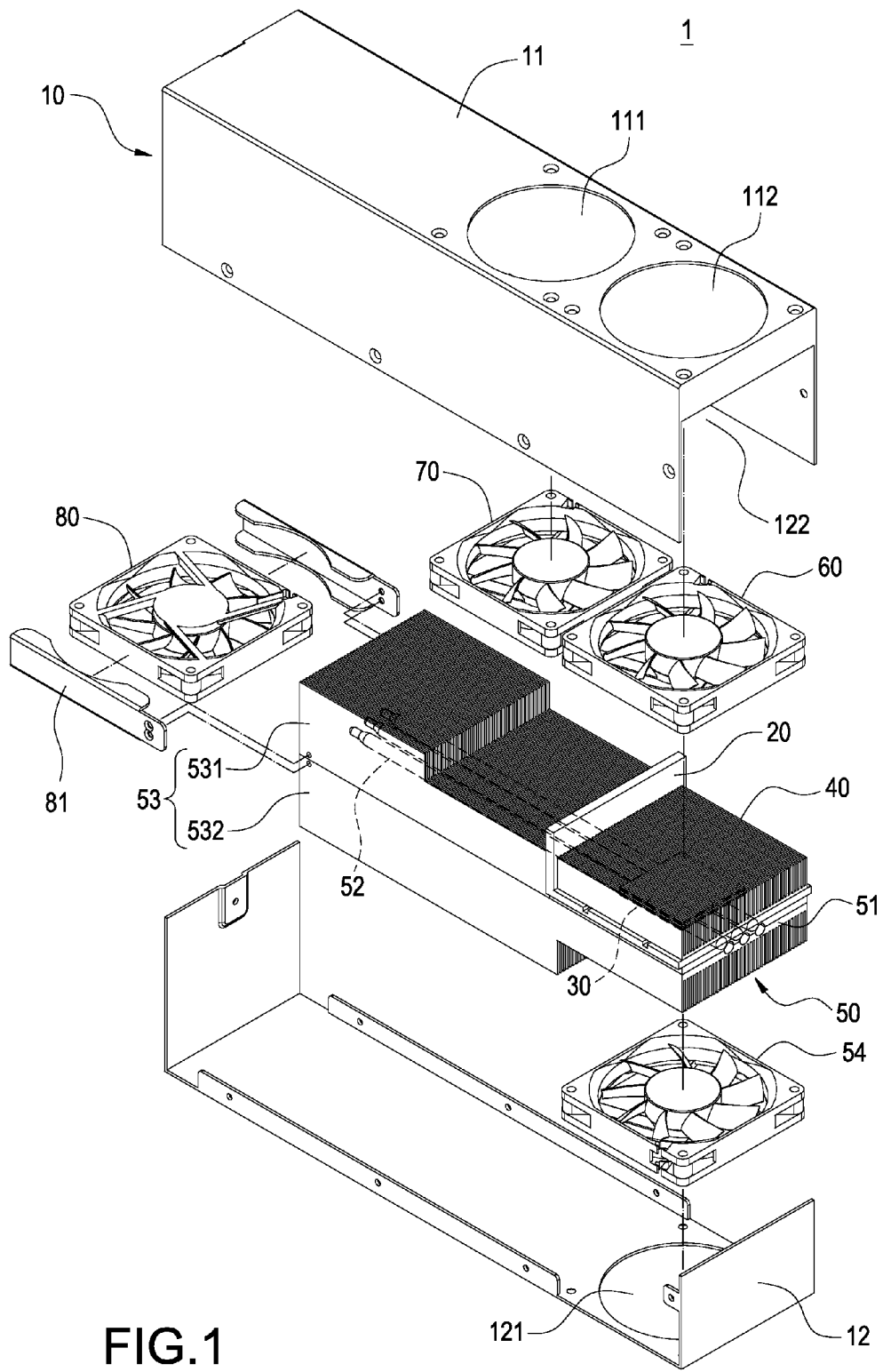
FIG. 1 is an exploded perspective view according to a first embodiment of the present invention.
Figure 3:
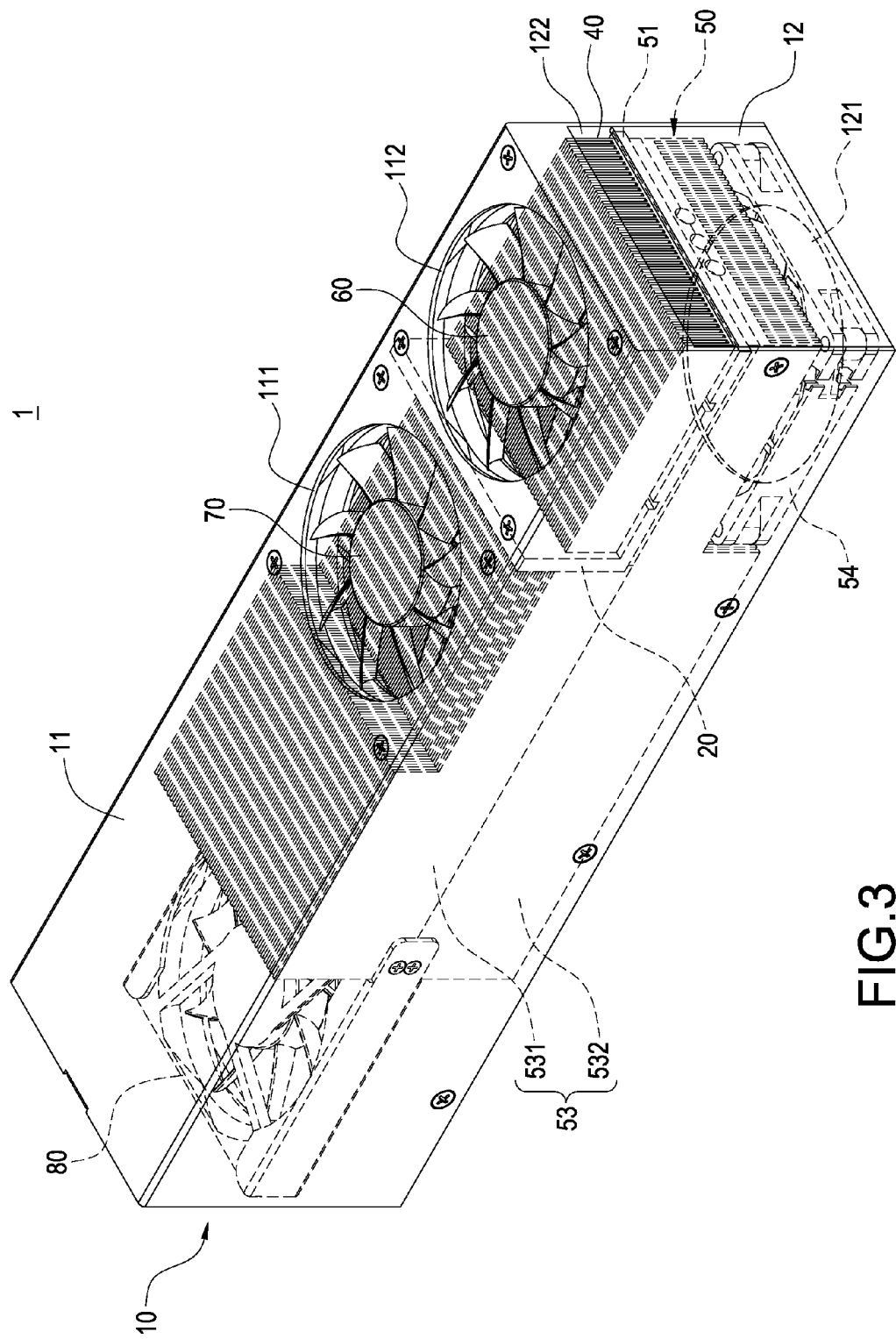
FIG. 3 is an assembled perspective view according to the first embodiment of the present invention.

Please refer to FIGS. 1 and 3. FIG. 1 is an exploded perspective view according to a first embodiment of the present invention, and FIG. 3 is an assembled perspective view according to the first embodiment of the present invention. The present invention provides a heat-dissipating device 1 for supplying cold airflow, which includes a casing 10, a thermal insulation plate 20, a thermoelectric cooling chip 30, a heat-dissipating body 40, and a cold-airflow supplying module 50.

As shown in FIG. 1, the casing 10 is a rectangularly cuboidal casing constituted of an upper shell 11 and a lower shell 12. The upper shell 11 is formed into an inverted U shape, while the lower shell 12 is formed into a U shape correspondingly. The upper shell 11 and the lower shell 12 are assembled with each other by screws (not shown). The top surface of the upper shell 11 is provided with a first air inlet 111 and a second air inlet 112. The bottom surface of the lower shell 12 is provided with a cold air outlet 121. As shown in the right side of FIG. 1, a hot air outlet 122 (FIG. 3) is formed between the upper shell 11 and the lower shell 12 when they are assembled with each other. However, FIG. 1 is illustrative only, and the casing 10 may be an integral casing as long as the surfaces of the casing 10 are provided with the first air inlet 111, the second air inlet 112, the cold air outlet 121 and the hot air outlet 122.

Figure 2:
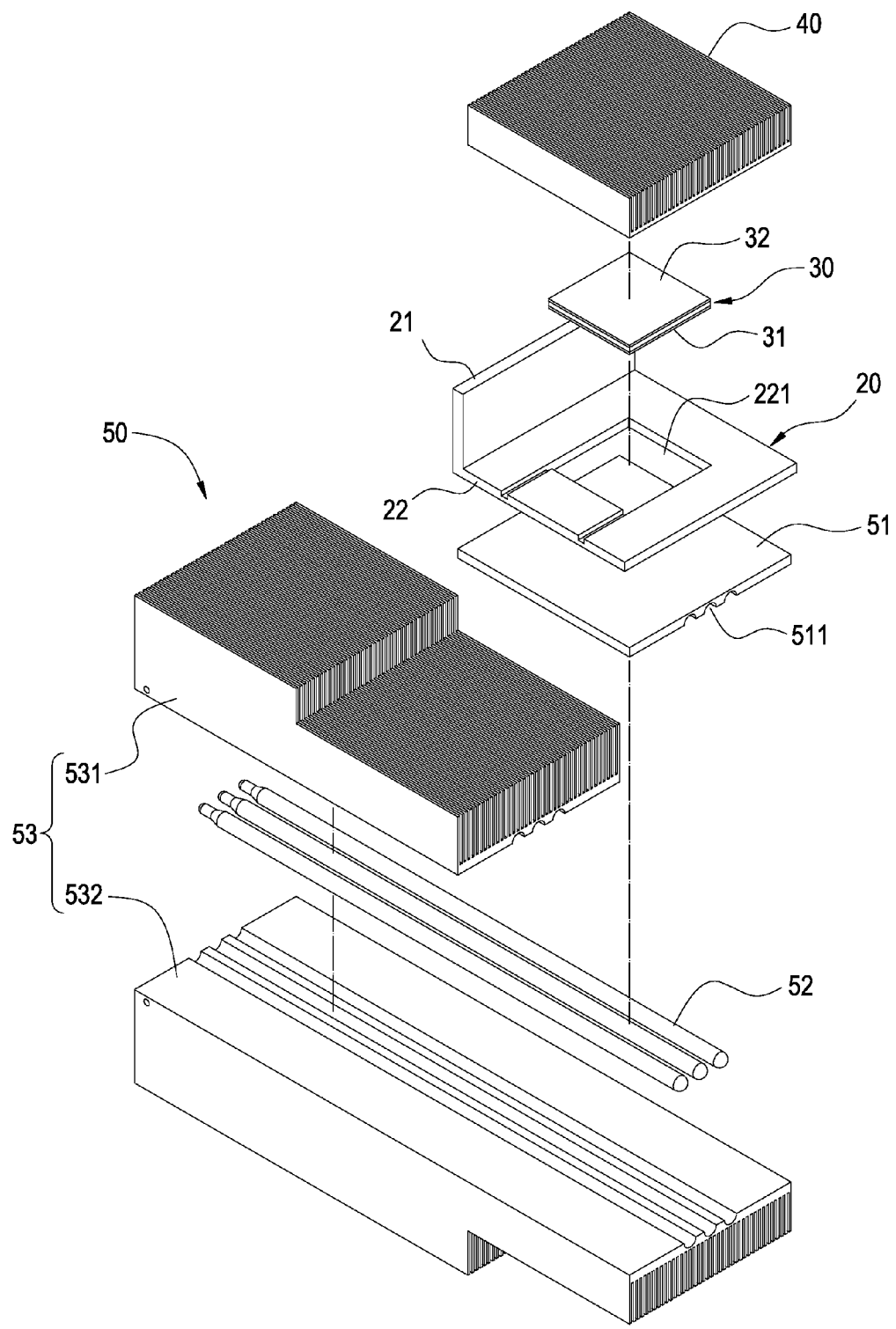
FIG. 2 is a partially exploded perspective view according to the first embodiment of the present invention.
Figure 4:
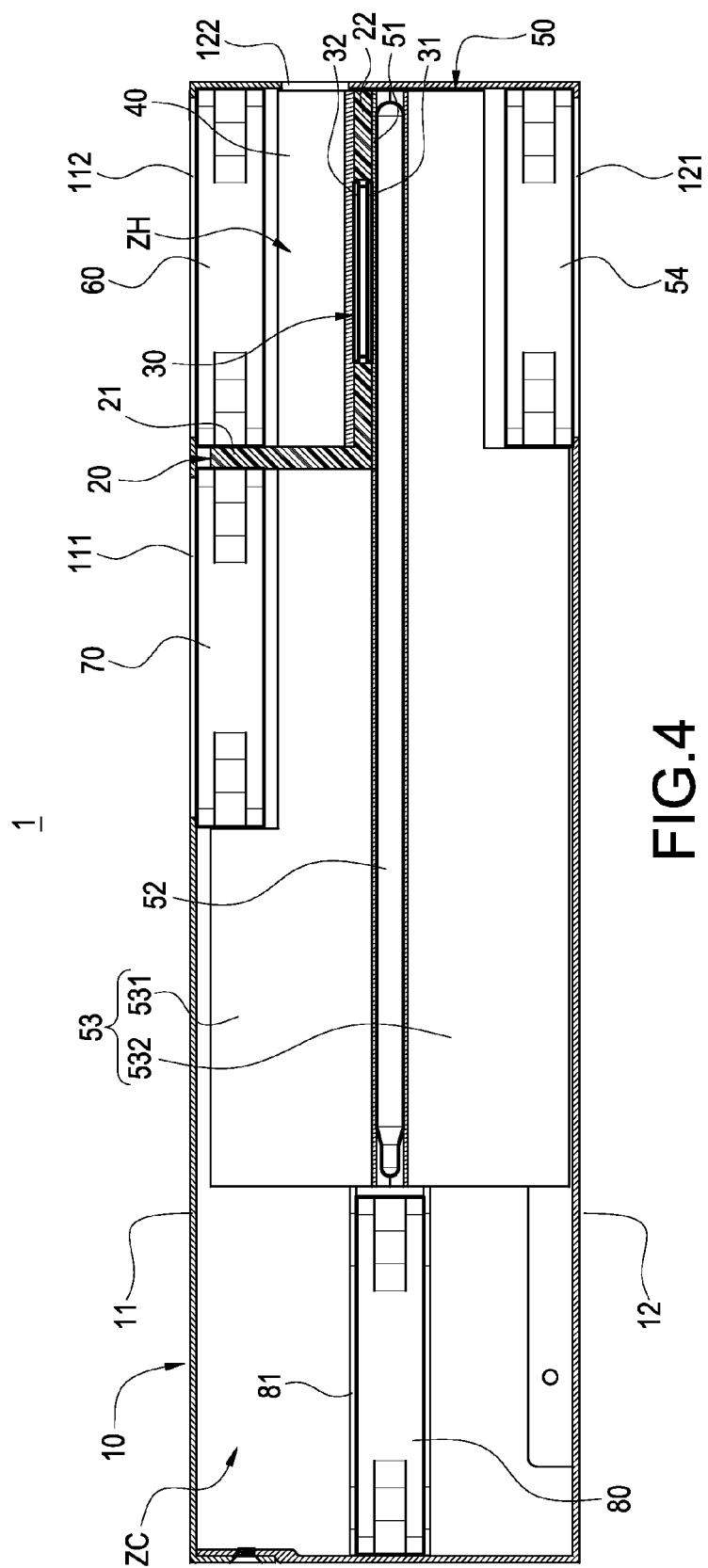
FIG. 4 is an assembled cross-sectional view according to the first embodiment of the present invention.

Please refer to FIGS. 2 and 4. The thermal insulation plate 20 is formed into an L shape and has a short portion 21 and a long portion 22 connected to the short portion 21. The thermal insulation plate 20 is disposed in the right-handed portion of the casing 10 to divide the interior of the casing 10 into a hot air zone ZH located in the upper-right corner and a cold air zone ZC completely separated from the hot air zone ZH. It can be seen clearly from FIG. 4 that the first air inlet 111 and the cold air outlet 121 are in communication with the cold air zone ZC, while the second air inlet 112 and the hot air outlet 122 are in communication with the hot air zone ZH. The long portion 22 of the thermal insulation plate 20 is provided with a through-hole 221 (FIG. 2) in which the thermoelectric cooling chip 30 is disposed.

The thermoelectric cooling chip 30 is also referred to as a thermoelectric cooling module or thermoelectric power generating module, in which a N-type semiconductor and a P-type semiconductor are connected to form an electric dipole for generating power after being supplied with a DC current. When the electric current flows from the N-type semiconductor to the P-type semiconductor, the heat around the P-type semiconductor will be absorbed to reduce its temperature. Thus, the surface close to the P-type semiconductor is called a cold-end surface. Conversely, the other surface opposite to the cold-end surface will be heated up, so that this surface is called a hot-end surface. The amount of heat absorbed or released depends on the value of the electric current. Since the thermoelectric cooling chip is well-known, the description thereof is omitted herein for clarity. The form of the thermoelectric cooling chip is not limited to a specific one in the present invention.

Therefore, in the present embodiment, the thermoelectric cooling chip 30 has a cold-end surface 31 and a hot-end surface 32 opposite to the cold-end surface 31. The thermoelectric cooling chip 30 is disposed in the through-hole 221 of the thermal insulation plate 20 with the hot-end surface 32 facing the hot air zone ZH. In other words, as shown in FIG. 4, the cold-end surface 31 faces downwards while the hot-end surface 32 faces upwards.

The heat-dissipating body 40 is provided in the hot air zone 20 and disposed on the long portion 22 of the thermal insulation plate 20 to abut against the hot-end surface 32 of the thermoelectric cooling chip 30. The heat-dissipating body 40 is constituted of aluminum-extruded heat-dissipating fins for conducting and dissipating the heat of the hot-end surface 32.

Please refer to FIG. 2. The cold-airflow supplying module 50 comprises a metallic cold-conducting plate 51, a plurality of super heat pipes 52, a cooler 53, and a first fan 54. The upper surface of the metallic cold-conducting plate 51 is a flat surface for contacting the cold-end surface 31 of the thermoelectric cooling chip 30, thereby rapidly conducting the cold generated by the cold-end surface 31 to other places. The lower surface of the metallic cold-conducting plate 51 is formed with a plurality of curved grooves 511 for allowing the super heat pipes 52 to be disposed therein and increasing the contact area with the super heat pipes 52. Thus, the metallic cold-conducting plate 51 is disposed between the cold-end surface 31 and the super heat pipes 52.

Each of the super heat pipes 52 is an elongated pipe and has an excellent thermo-conductivity. In the present embodiment, there are three super heat pipes 52 that are provided in the cold air zone ZC with a portion thereof being inserted into the grooves 511 of the metallic cold-conducting plate 51. With the grooves 511 of the metallic cold-conducting plate 51, the super heat pipes 52 can be brought into firm contact with the metallic cold-conducting plate 51, thereby rapidly conducting the cold generated by the cold-end surface 31 of the thermoelectric cooling chip 30 to other places.

The cooler 53 is disposed in the cold air zone ZC to contact the super heat pipes 52. As shown in FIG. 2, the cooler 53 is constituted of an upper cooling portion 531 and a lower cooling portion 532. The upper cooling portion 531 is adjacent to the first air inlet 111, and the lower cooling portion 532 is adjacent to the cold air outlet 121. The super heat pipe 52 are connected between the upper cooling portion 531 and the lower cooling portion 532, so that the cold generated by the cold-end surface 31 can be conducted rapidly to the cooler 53 along the length of the super heat pipes 52 and a direction perpendicular to the super heat pipes 52. As a result, the airflow in the cold air zone ZC can be heat-exchanged uniformly with the upper cooling portion 531 and the lower cooling portion 532, thereby generating a cold airflow with a consistent temperature.

Incidentally, the cooler 53 is not limited to be constituted of the upper cooling portion 531 and the lower cooling portion 532. Of course, the cooler 53 may be constituted of integral aluminum-extruded fins as long as it extends into the cold air zone ZC as far as possible to contact the super heat pipes 52 and uniformly conducts the cold of the super heat pipes 52 to the cold air zone ZC.

Figure 5:
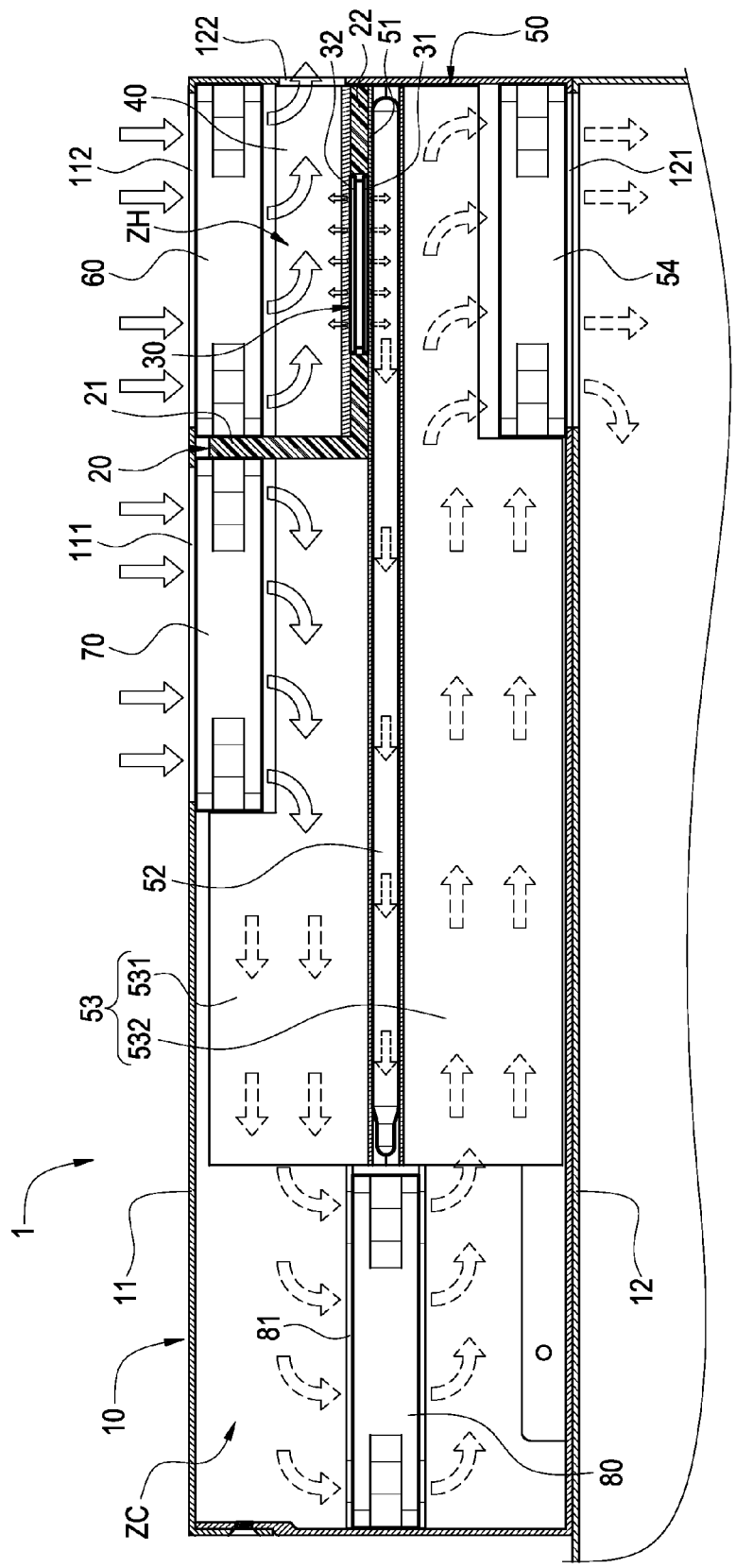
FIG. 5 is a schematic view showing the airflow in an operating state according to the first embodiment of the present invention.

Please refer to FIG. 5. The first fan 54 is fixed to the cold air outlet 121 of the lower casing 12 for guiding external air to enter the cold air zone ZC via the first air inlet 111 and be ejected from the cold air outlet 121. After the external air enters the casing 10 via the first air inlet 111, the external air contacts the upper cooling portion 531 of the cooler 53 first to be cooled. The airflow is then guided by the inner wall of the casing 10 to flow to the lower cooling portion 532. Since the upper cooling portion 531 and the lower cooling portion 532 contact the super heat pipes 52 directly with the same temperature, the cold airflow in the whole cold air zone ZC can be kept at a specific temperature. Finally, the cold airflow in the cold air zone ZC can be ejected from the cold air outlet 121 and enter a desired computer host (not shown) by means of the suction force generated when the first fan 54 is rotating.

The present invention further includes a second fan 60 fixed to the second air inlet 112 of the upper casing 11 for guiding external air to enter the hot air zone ZH via the second air inlet 112, thereby heat-exchanging with the heat-dissipating body 40 to form a hot airflow. In this way, the heat generated by the hot-end surface 32 of the heat-dissipating body 40 can be dissipated via the hot air outlet 122. The purpose of the hot air zone ZH is to dissipate the heat of the hot-end surface 32 to the outside of the casing 10, thereby maintaining the normal operation of the thermoelectric cooling chip 30. In this embodiment, the thermal insulation plate 30 separates the hot air zone ZH from the cold air zone ZC completely, so that the hot airflow in the hot air zone ZH cannot flow into the cold air zone ZC (and vice versa). The hot airflow can be only exhausted to the outside via the hot air outlet 122.

It should be noted that, in order to increase the flowing rate of the airflow in the cold air zone ZC, a third fan 70 can be further provided in the first air inlet 111. The third fan 70 is fixed to the upper shell 11. Further, a fourth fan 80 may be provided in the cold air zone ZC in a flowing path between the first air inlet 111 and the first fan 54, thereby the cold airflow passing through the upper cooling portion 531 can be guided rapidly to flow to the lower cooling portion 532 without staying in the cold air zone ZC. It should be noted that both sides of the fourth fan 80 are fixed to the cooler 53 by means of a bracket 81 (FIG. 1) respectively, so that the fourth fan 81 can be fixedly disposed in the cold air zone ZC.

Figure 6:
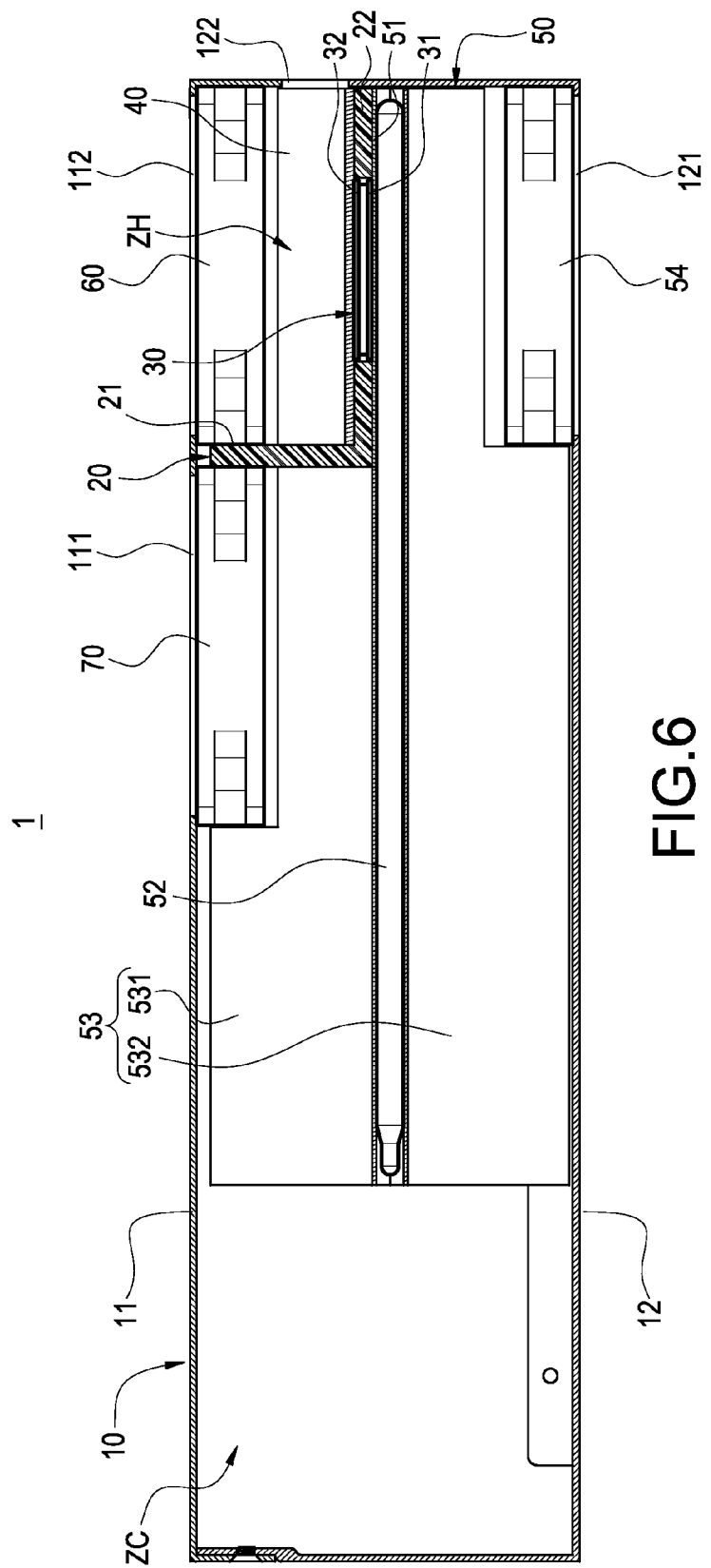
FIG. 6 is an assembled cross-sectional view according to a second embodiment of the present invention.

Please refer to FIG. 6 showing the second embodiment of the present invention. The difference between the second embodiment and the first embodiment lies in that the fourth fan 80 is omitted. The second embodiment is applied in such a case that the inner space of the casing 10 is too small to be mounted by the fourth fan 80 therein. On the other hand, since the inner space of the casing 10 is smaller, it is not necessary to provide the fourth fan 80 because the cold airflow does not stay in the cold air zone ZC easily.

Figure 7:
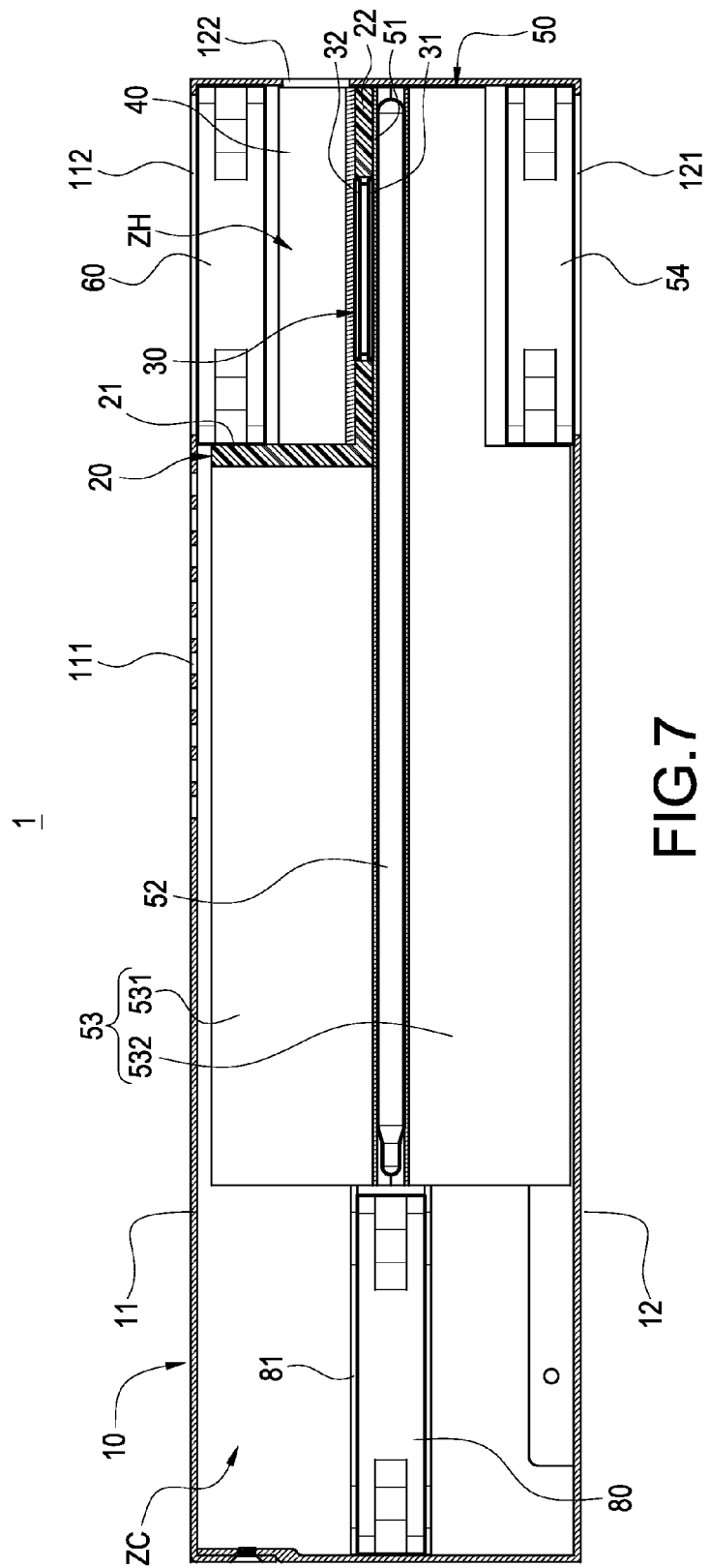
FIG. 7 is an assembled cross-sectional view according to a third embodiment of the present invention.

Please refer to FIG. 7 showing the third embodiment of the present invention. The difference between the third embodiment and the first embodiment lies in that the third fan 70 is not provided in the first air inlet 111. The external air is guided compulsively by the fourth fan 80 to enter the first air inlet 111.

Figure 8:
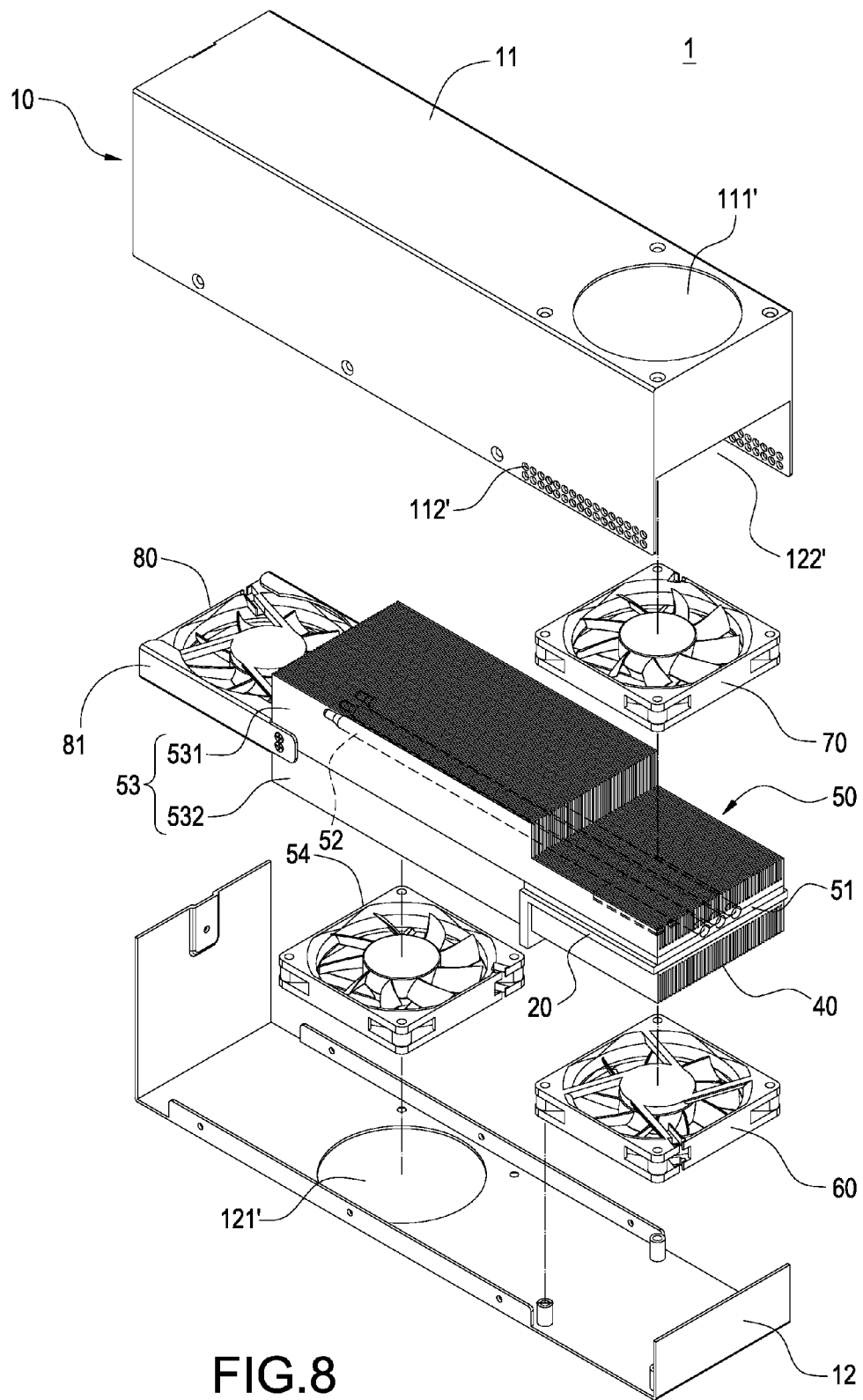
FIG. 8 is an exploded perspective view according to a fourth embodiment of the present invention.
Figure 9:
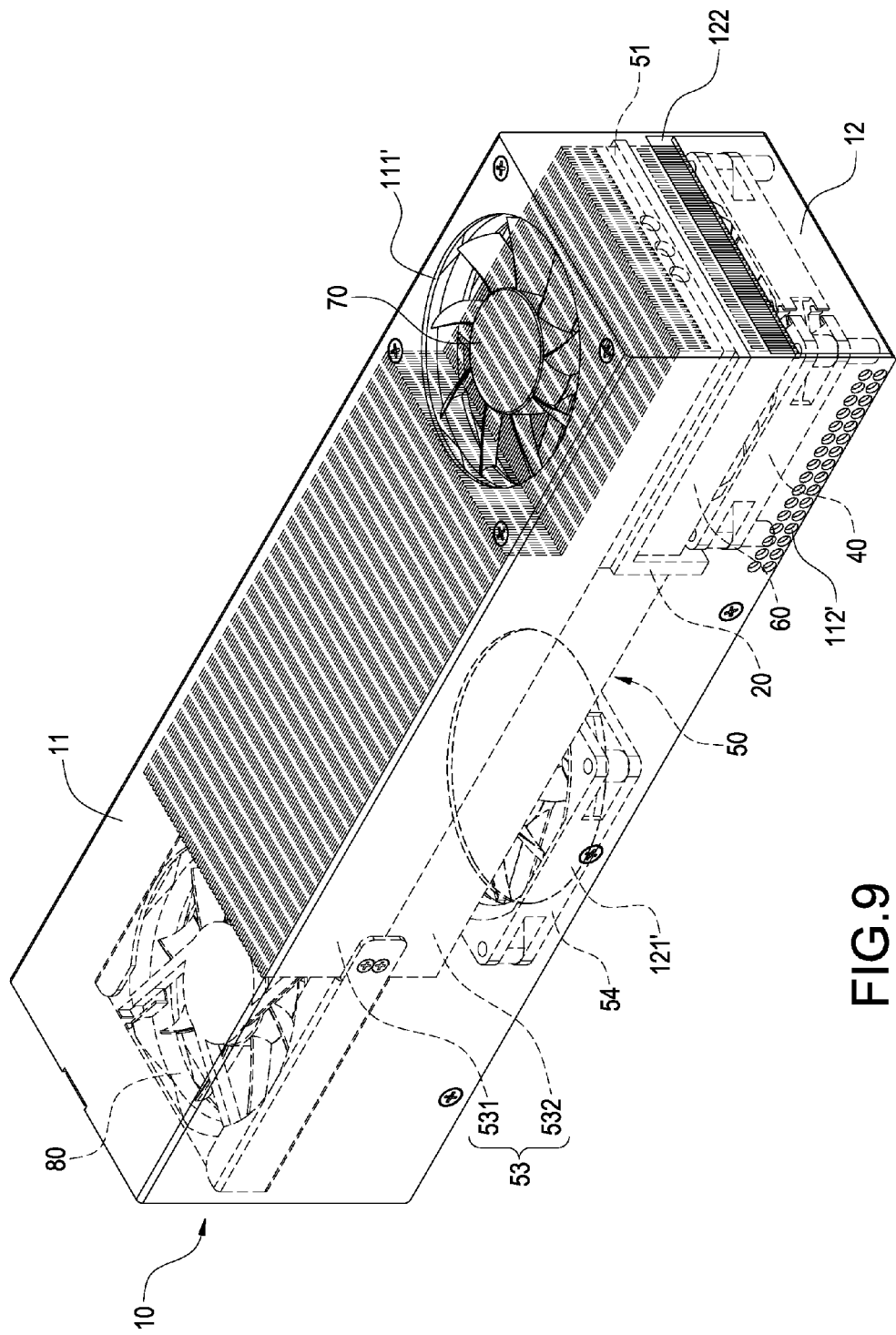
FIG. 9 is an assembled perspective view according to the fourth embodiment of the present invention.
Figure 10:
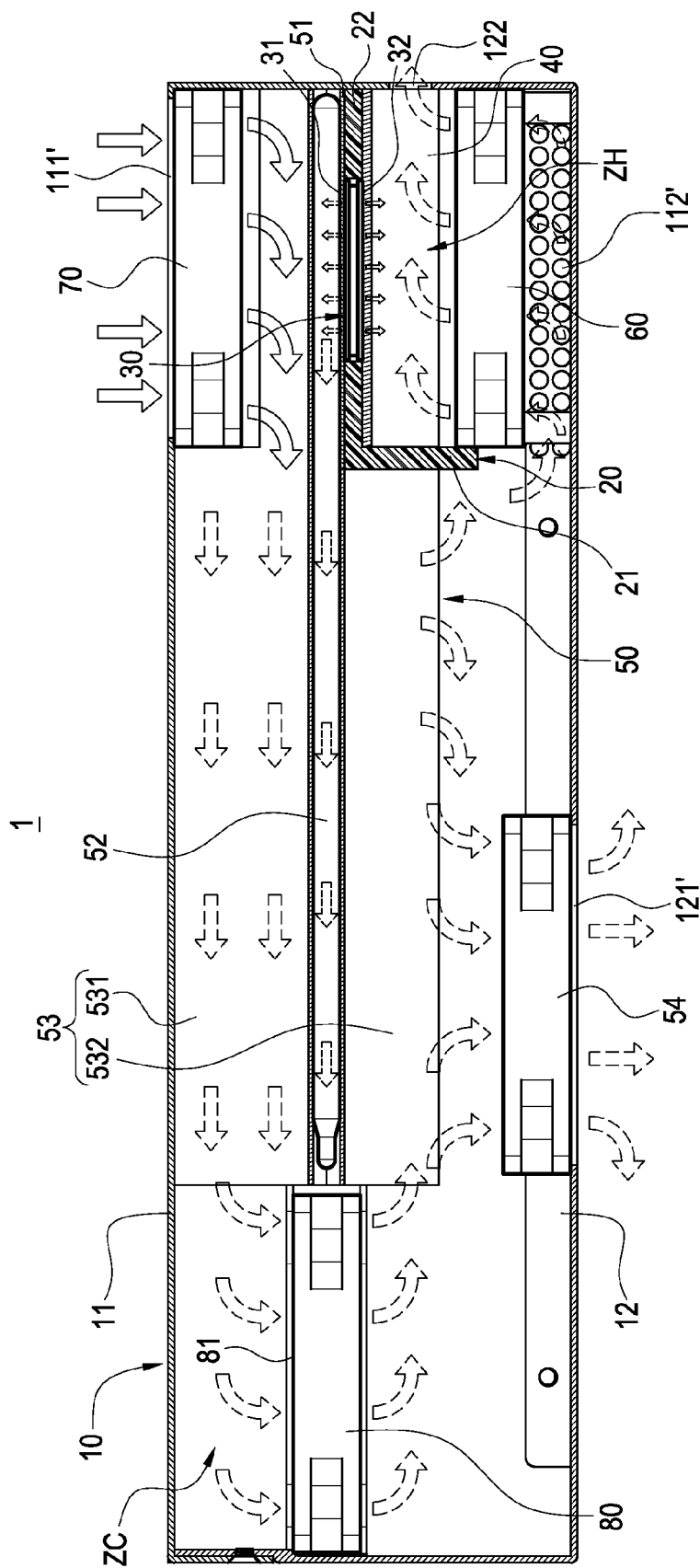
FIG. 10 is a schematic view showing the airflow in an operating state according to the fourth embodiment of the present invention.

Please refer to FIGS. 8 to 10 showing the fourth embodiment of the present invention. The difference between the fourth embodiment and the first embodiment lies in that the thermal insulation plate 10 and the thermoelectric cooling chip 30 are positioned in an inverted manner. Similarly, the casing 10 is constituted of an upper shell 11 and a lower shell 12. The upper shell 11 is formed into an inverted U shape. The upper surface of the upper shell 11 is provided with a first air inlet 111', and the lower edge of a side surface thereof is provided with a second air inlet 112'. The lower shell 12 is formed into a U shape correspondingly. The lower surface of the lower shell 12 is provided with a cold air outlet 121'. The upper shell 11 and the lower shell 12 are assembled with each other by screws (not shown). As shown in the right side of FIG. 8, a hot air outlet 122' (FIG. 9) is formed between the upper shell 11 and the lower shell 12 when they are assembled with each other. However, FIG. 8 is illustrative only, and the casing 10 may be an integral casing as long as the surfaces of the casing 10 are provided with the first air inlet 111', the second air inlet 112', and the hot air outlet 122'.

The thermal insulation plate 20 is formed into an L shape and has a short portion 21 and a long portion 22 connected to the short portion 21. The thermal insulation plate 20 is disposed in the right-handed portion of the casing 10 to divide the interior of the casing 10 into a hot air zone ZH located in the lower-right corner and a cold air zone ZC partially communicated with the hot air zone ZH. It can be seen clearly from FIG. 10 that the first air inlet 111' and the cold air outlet 121' are in communication with the cold air zone ZC, while the second air inlet 112' and the hot air outlet 122' are in communication with the hot air zone ZH. Although not shown in FIGS. 8 to 10, like the first embodiment, the long portion 22 of the thermal insulation plate 20 is provided with a through-hole 221 (FIG. 2) in which a thermoelectric cooling chip 30 is disposed.

Similarly, in the present embodiment, the thermoelectric cooling chip 30 has a cold-end surface 31 and a hot-end surface 32 opposite to the cold-end surface 31. The thermoelectric cooling chip 30 is disposed in the through-hole 221 of the thermal insulation plate 20 with the hot-end surface 32 facing the hot air zone ZH. In other words, as shown in FIG. 10, the cold-end surface 31 faces upwards while the hot-end surface 32 faces downwards.

The heat-dissipating body 40 is provided in the hot air zone ZH and disposed below the long portion 22 of the thermal insulation plate 20 to abut against the hot-end surface 32 of the thermoelectric cooling chip 30. The heat-dissipating body 40 is constituted of aluminum-extruded heat-dissipating fins for conducting and dissipating the heat of the hot-end surface 32.

Like the first embodiment, the cold-airflow supplying module 50 comprises a metallic cold-conducting plate 51, a plurality of super heat pipes 52, a cooler 53, and a first fan 54. The lower surface of the metallic cold-conducting plate 51 is a flat surface for contacting the cold-end surface 31 of the thermoelectric cooling chip 30, thereby rapidly conducting the cold generated by the cold-end surface 31 to other places. The upper surface of the metallic cold-conducting plate 51 is formed with a plurality of curved grooves (not shown) for allowing the super heat pipes 52 to be disposed therein and increasing the contact area with the super heat pipes 52. Thus, the metallic cold-conducting plate 51 is disposed between the cold-end surface 31 and the super heat pipes 52.

Each of the super heat pipes 52 is an elongated pipe and has an excellent thermal or cold conductivity. In the present embodiment, there are three super heat pipes 52 that are provided in the cold air zone ZC with a portion thereof being inserted into the grooves of the metallic cold-conducting plate 51. With the grooves of the metallic cold-conducting plate 51, the super heat pipes 52 can be brought into firm contact with the metallic cold-conducting plate 51, thereby rapidly conducting the cold generated by the cold-end surface 31 of the thermoelectric cooling chip 30 to other places.

The cooler 53 is disposed in the cold air zone ZC to contact the super heat pipes 52. As shown in FIG. 8, the cooler 53 is constituted of an upper cooling portion 531 and a lower cooling portion 532, both of which are constituted of aluminum-extruded fins. The upper cooling portion 531 is adjacent to the first air inlet 111', and the lower cooling portion 532 is adjacent to the cold air outlet 121'. The super heat pipe 52 are connected between the upper cooling portion 531 and the lower cooling portion 532, so that the cold generated by the cold-end surface 31 can be conducted rapidly to the cooler 53 along the length of the super heat pipes 52 and a direction perpendicular to the super heat pipes 52. As a result, the airflow in the cold air zone ZC can be heat-exchanged uniformly with the upper cooling portion 531 and the lower cooling portion 532, thereby generating a cold airflow with a consistent temperature.

Incidentally, the cooler 53 is not limited to be constituted of the upper cooling portion 531 and the lower cooling portion 532. Of course, the cooler 53 may be constituted of integral aluminum-extruded fins as long as it extends into the cold air zone ZC as far as possible to contact the super heat pipes 52 and uniformly conducts the cold of the super heat pipes 52 to the cold air zone ZC.

Please refer to FIG. 10. The first fan 54 is fixed to the cold air outlet 121' of the lower casing 12 for guiding external air to enter the cold air zone ZC via the first air inlet 111' and be ejected from the cold air outlet 121'. After the external air enters the casing 10 via the first air inlet 111', the external air contacts the upper cooling portion 531 of the cooler 53 first to reduce its temperature. The airflow is then guided by the inner wall of the casing 10 to flow to the lower cooling portion 532. Since the upper cooling portion 531 and the lower cooling portion 532 contact the super heat pipes 52 directly with the same temperature, the cold airflow in the whole cold air zone ZC can be kept in a consistent temperature. Finally, the cold airflow in the cold air zone ZC can be ejected from the cold air outlet 121' and enter a desired computer host (not shown) by means of the suction force generated when the first fan 54 is rotating.

The present invention further includes a second fan 60 fixed in the hot air zone ZH for guiding a portion of the cold airflow to enter the hot air zone ZH, thereby heat-exchanging with the heat-dissipating body 40 to form a hot airflow. In this way, the heat generated by the hot-end surface 32 of the heat-dissipating body 40 can be dissipated via the hot air outlet 122'. The purpose of the hot air zone ZH is to dissipate the heat of the hot-end surface 32 to the outside of the casing 10, thereby maintaining the normal operation of the thermoelectric cooling chip 30. In this embodiment, since the hot air zone ZH is partially communicated with the cold air zone ZC, a portion of the cold airflow in the cold air zone ZC can flow into the hot air zone ZH by bypassing the thermal insulation plate 20.

It should be noted that, in order to increase the flowing rate of the airflow in the cold air zone ZC, a third fan 70 is further provided in the first air inlet 111'. The third fan 70 is fixed to the upper shell 11. Further, a fourth fan 80 may be provided in the cold air zone ZC in a flowing path between the first air inlet 111' and the first fan 54, whereby the cold airflow passing through the upper cooling portion 531 can be guided rapidly to flow to the lower cooling portion 532 without staying in the cold air zone ZC. It should be noted that both sides of the fourth fan 80 are fixed to the cooler 53 by means of a bracket 81 (FIG. 8) respectively, so that the fourth fan 81 can be fixedly disposed in the cold air zone ZC.

It should be noted that, in the present embodiment, since the thermal insulation plate 20 does not separate the cold air zone ZC from the hot air zone ZH completely, a portion of the cold airflow in the cold air zone ZC can be guided to enter the hot air zone ZH by means of the first fan 54. Thus, even though the second air inlet 112' is not provided for introducing external air into the casing 10, only using a portion of the cold airflow in the cold air zone ZC is sufficient for the heat dissipation of the heat-dissipating body 40.

In comparison with prior art, the present invention has advantageous features as follows.

Since the present invention is provided with a cold-airflow supplying module 50 contacting the cold-end surface 31 of the thermoelectric cooling chip 30, and the cold-airflow supplying module 50 comprises a plurality of super heat pipes 52, a cooler 53 contacting the super heat pipes 52 and a first fan 54, the cold generated by the cold-end surface 31 can be rapidly and uniformly conducted to the cooler 53 by means of the super heat pipes 52. In other words, the combination of the super heat pipes 52 and the cooler 53 significantly increases the contact area and heat-exchanging distance with the cold-end surface 31. Thus, the external air introduced in the heat-dissipating device 1 from the first air inlet 111 can be heat-exchanged with the cooler 53 in the cold air zone ZC sufficiently and uniformly. Thus, frost and condensed droplets will not be generated on the cold-end surface 31.

According to the above, since the external air introduced in the heat-dissipating device 1 from the first air inlet 111 can be heat-exchanged with the cooler 53 in the cold air zone ZC sufficiently and uniformly, the temperature of the cold air in the cold air zone ZC is so consistent that the airflow finally flowing into a computer host is cold enough.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A heat-dissipating device (1) for supplying cold airflow, comprising:
   a casing (10) provided with a first air inlet (111), a second air inlet (112), a cold air outlet (121), and a hot air outlet (122) therein;
   a thermal insulation plate (20) having a through-hole (221) and disposed in the casing (10) for dividing an interior of the casing (10) into a hot air zone (ZH) and a cold air zone (ZC) separated completely from the hot air zone (ZH), the first air inlet (111) and the cold air outlet (121) being in communication with the cold air zone (ZC), and the second air inlet (112) and the hot air outlet (122) being in communication with the hot air zone (ZH);
   a thermoelectric cooling chip (30) having a cold-end surface (31) and a hot-end surface (32) opposite to the cold-end surface (31), and being disposed in the through-hole (221) with the hot-end surface (32) facing the hot air zone (ZH);
   a heat-dissipating body (40) disposed in the hot air zone (ZH) to abut against the hot-end surface (32);
   a cold-airflow supplying module (50) disposed in the cold air zone (ZC) to abut against the cold-end surface (31), and comprising a plurality of super heat pipes (52), a cooler (53) contacting the super heat pipes (52) and a first fan (54), wherein the first fan (54) is mounted in the cold air outlet (121) for guiding external air to enter the cold air zone (ZC) via the first air inlet (111) and be ejected from the cold air outlet (121); and
   a second fan (60) mounted in the second air inlet (112) for guiding external air to enter the hot air zone (ZH) via the second air inlet (112) and be ejected from the hot air outlet (122).

2. The heat-dissipating device (1) for supplying cold airflow according to claim 1, wherein the casing (10) is constituted of an upper shell (11) and a lower shell (12), the first air inlet (111) and the second air inlet (112) are provided on the upper shell (11), the cold air outlet (121) is provided on the lower shell (12), the hot air outlet (122) is formed between the upper shell (11) and the lower shell (12), the first fan (54) is fixed to the lower shell (12), and the second fan (60) is fixed to the upper shell (11).

3. The heat-dissipating device (1) for supplying cold airflow according to claim 2, further including a third fan (70) provided in the first air inlet (111), the third fan (70) being fixed to the upper shell (11).

4. The heat-dissipating device (1) for supplying cold airflow according to claim 2, further including a fourth fan (80) provided in the cold air zone (ZC) in a flowing path between the first air inlet (111) and the first fan (54), the fourth fan (80) being fixed to the cooler (53).

5. The heat-dissipating device (1) for supplying cold airflow according to claim 2, wherein the cooler (53) is constituted of an upper cooling portion (531) and a lower cooling portion (532), the upper cooling portion (531) is adjacent to the first air inlet (111), the lower cooling portion (532) is adjacent to the cold air outlet (121), and the super heat pipes (52) are connected between the upper cooling portion (531) and the lower cooling portion (532).

6. The heat-dissipating device (1) for supplying cold airflow according to claim 2, wherein the thermal insulation plate (20) is formed into an L shape and has a short portion (21) and a long portion (22) connected to the short portion (21), the through-hole (221) is provided in the long portion (22), the heat-dissipating body (40) is disposed on the long portion (40) to contact the thermoelectric cooling chip (30).

7. The heat-dissipating device (1) for supplying cold airflow according to claim 2, wherein the cold-airflow supplying module (50) further comprises a metallic cold-conducting plate (51) provided between the cold-end surface (31) and the super heat pipes (52), the metallic cold-conducting plate (51) is provided with a plurality of grooves (511) for allowing the super heat pipes (52) to be inserted therein.

8. A heat-dissipating device (1) for supplying cold airflow, comprising:
   a casing (10) provided with a first air inlet (111'), a cold air outlet (121'), and a hot air outlet (122');
   a thermal insulation plate (20) having a through-hole (221) and disposed in the casing (10) for dividing an interior of the casing (10) into a hot air zone (ZH) and a cold air zone (ZC) partially communicated with the hot air zone (ZH), the first air inlet (111') and the cold air outlet (121') being in communication with the cold air zone (ZC), the hot air outlet (122') being in communication with the hot air zone (ZH);
   a thermoelectric cooling chip (30) having a cold-end surface (31) and a hot-end surface (32) opposite to the cold-end surface (31), and being disposed in the through-hole (221) with the hot-end surface (32) facing the hot air zone (ZH);
   a heat-dissipating body (40) disposed in the hot air zone (ZH) to abut against the hot-end surface (32);
   a cold-airflow supplying module (50) disposed in the cold air zone (ZC) to abut against the cold-end surface (31), and comprising a plurality of super heat pipes (52), a cooler (53) contacting the super heat pipes (52) and a first fan (54), wherein the first fan (54) is mounted in the cold air outlet (121') for guiding external air to enter the cold air zone (ZC) via the first air inlet (111') and be ejected from the cold air outlet (121'); and
   a second fan (54) mounted in hot air zone (ZH) for guiding a portion of airflow of the cold air zone (ZC) to enter the hot air zone (ZH) and be ejected from the hot air outlet (122').

9. The heat-dissipating device (1) for supplying cold airflow according to claim 8, further including a second air inlet (112') provided on the casing (10) in communication with the hot air zone (ZH), the second fan (60) guiding external air to enter the hot air zone (ZH) via the second air inlet (112').

10. The heat-dissipating device (1) for supplying cold airflow according to claim 9, wherein the casing (10) is constituted of an upper shell (11) and a lower shell (12), the first air inlet (111') and the second air inlet (112') are provided on the upper shell (11), the cold air outlet (121') is provided on the lower shell (12), the hot air outlet (122') is formed between the upper shell (11) and the lower shell (12), the first fan (54) is fixed to the lower shell (12), and the second fan (60) is fixed to the upper shell (11).

11. The heat-dissipating device (1) for supplying cold airflow according to claim 10, further including a third fan (70) provided in the first air inlet (111'), the third fan (70) being fixed to the upper shell (11).

12. The heat-dissipating device (1) for supplying cold airflow according to claim 10, further including a fourth fan (80) provided in the cold air zone (ZC) in a flowing path between the first air inlet (111') and the first fan (54), the fourth fan (80) being fixed to the cooler (53).

13. The heat-dissipating device (1) for supplying cold airflow according to claim 10, wherein the cooler (53) is constituted of an upper cooling portion (531) and a lower cooling portion (532), the upper cooling portion (531) is adjacent to the first air inlet (111'), the lower cooling portion (532) is adjacent to the cold air outlet (121'), and the super heat pipes (52) are connected between the upper cooling portion (531) and the lower cooling portion (532).

14. The heat-dissipating device (1) for supplying cold airflow according to claim 10, wherein the thermal insulation plate (20) is formed into an L shape and has a short portion (21) and a long portion (22) connected to the short portion (21), the through-hole (221) is provided in the long portion (22), the heat-dissipating body (40) is disposed below the long portion (40) to contact the thermoelectric cooling chip (30).

15. The heat-dissipating device (1) for supplying cold airflow according to claim 10, wherein the cold-airflow supplying module (50) further comprises a metallic cold-conducting plate (51) provided between the cold-end surface (31) and the super heat pipes (52), the metallic cold-conducting plate (51) is provided with a plurality of grooves (511) for allowing the super heat pipes (52) to be inserted therein.

* * * * *